United States Patent [19]
Olsson

[11] Patent Number: 4,645,287
[45] Date of Patent: Feb. 24, 1987

[54] SURFACE MOUNT CONNECTOR
[75] Inventor: Billy E. Olsson, New Cumberland, Pa.
[73] Assignee: AMP Incorporated, Harrisburg, Pa.
[21] Appl. No.: 773,969
[22] Filed: Sep. 9, 1985
[51] Int. Cl.⁴ ............................................. H01R 9/09
[52] U.S. Cl. ............................ 339/125 R; 339/17 LC
[58] Field of Search ......... 339/17 LM, 125 R, 128 R, 339/139, 17 CF

[56] References Cited
U.S. PATENT DOCUMENTS
3,402,384 9/1968 Murakami et al. ................... 339/128
3,902,777 9/1975 Anhalt et al. ............. 339/17 CF X
4,009,921 3/1977 Narozny ..................... 339/125 R X Primary Examiner—Eugene F. Desmond
Attorney, Agent, or Firm—F. Brice Faller; Bruce J. Wolstoncroft

[57] ABSTRACT

Surface mount electrical connector has stamped U-shaped metal clips fitted on opposite ends of connector housing. Clip has transverse portion fitted flushly in top surface of housing to aid robotic placement. Shoulders stamped on parallel legs of clip provide snap fit to housing. Distal ends of legs extend below housing for interference fit in plated through holes of circuit board to anchor connector during soldering operations.

6 Claims, 3 Drawing Figures

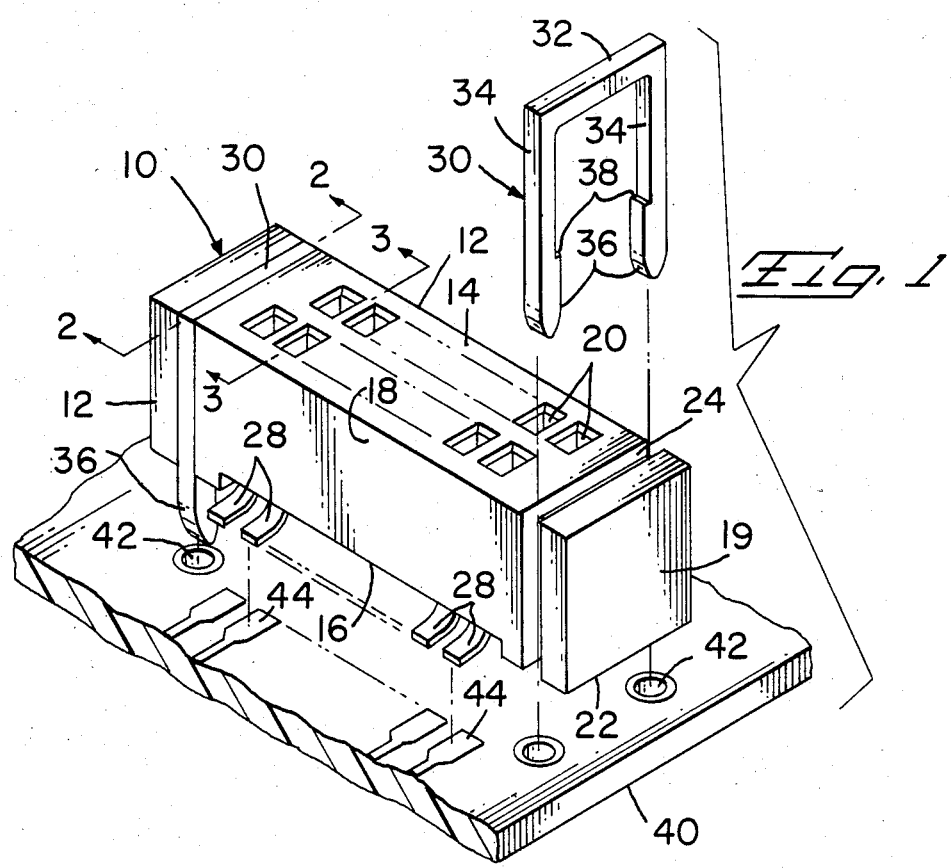
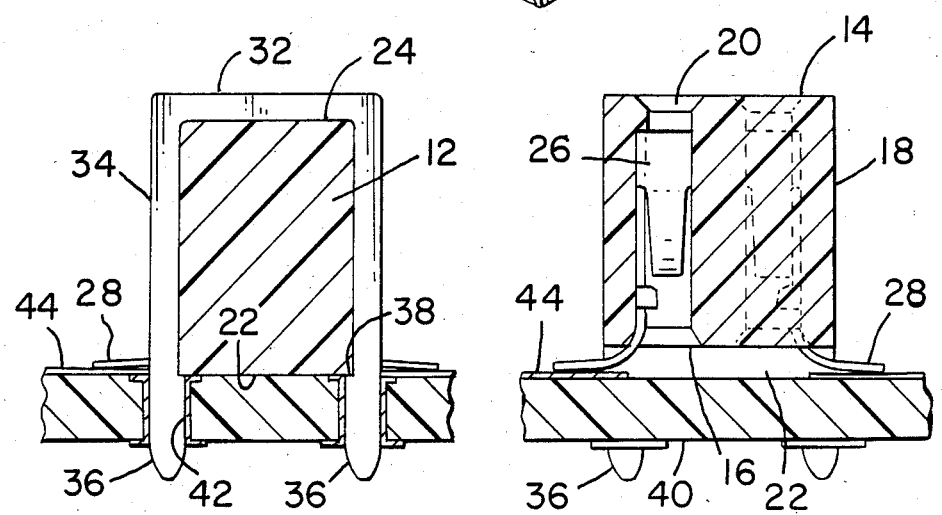

SURFACE MOUNT CONNECTOR

BACKGROUND OF THE INVENTION

The present invention relates to a surface mount electrical connector having circuit board retention means adapted for robotic handling.

Connectors having terminals with solder tails extending therefrom for reception in plated through holes of a printed circuit board are well known. Recently, in the interests of facilitating automated placement and economy of circuit board manufacture, "surface mount" connectors have been developed. Such connectors have terminals with solder tails formed for disposition against plated pads on the surface of the board. The terminals are typically fixed in the connector housing, and the tails are formed to sufficient length to assure compliance with the pads regardless of board warpage.

In order to secure the connector to the board until soldering of tails to pads is completed, legs could be molded integrally with the connector housing for interference fit in mounting holes in the board, cf. U.S. Pat. No. 4,195,900. The heat incurred during soldering can cause such legs to deform plastically, decreasing the retention force. While this presents little problem for a connector with pins soldered in plated through holes, the solder joints of a surface mount connector would be subjected to possibly damaging stress if the connector is rocked during mating or unmating of a complementary connector.

SUMMARY OF THE INVENTION

According to the invention, a U-shaped metal clip is provided on each end of the connector housing. The clip comprises a transverse portion and two parallel legs extending therefrom, the transverse portion being received flushly in the top of the housing. The legs are received in respective housing sidewalls and have distal ends extending beyond the bottom surface of the housing for interference fit in mounting holes of the circuit board. The mounting holes are plated so that the clips may be soldered therein, thus positively anchoring the connector and protecting the solder joints between the tails and pads on the surface of the board against stress.

U-clips offer the advantage of ease in assembly to the housing. Shoulders provided on the legs provide a snap fit against the bottom surface of the housing.

Channels are provided in the housing so that each clip, except for the distal ends of the legs, is flush with the housing. This feature allows assembly of the connector to the printed circuit board by simply bearing against the top surface of the housing. This facilitates robotic handling, which is becoming increasingly popular in the assembly of components and connectors to printed circuit boards.

BRIEF DESCRIPTION OF THE DRAWINGS

FIG. 1 is a perspective of the connector with a clip exploded therefrom.

FIG. 2 is an end section taken along line 2—2 of FIG. 1.

FIG. 3 is an end section taken along line 3—3 of FIG. 1.

DETAILED DESCRIPTION OF THE PREFERRED EMBODIMENT

Referring to FIG. 1, the connector 10 comprises a molded dielectric housing 12 having a top surface 14, an opposed bottom surface 16, opposed parallel sidewalls 18, and opposed ends 19. Contact receiving passages 20 extend between surfaces 14, 16 and contain contacts 26 (FIG. 3) having compliant solder tails 28 extending from the bottom surface 16 laterally of sidewalls 18 for reception against pads 44 on printed circuit board 40. The bottom surface 16 has a pair of standoffs 22 toward respective ends 19, which standoffs provide space for the tails to comply with any warpage of circuit board 50.

The housing 12 is molded with a pair of channels 24 toward respective ends 19, each channel 24 being continuous between opposed sidewalls 18 through top surface 14 and profiled to receive a U-shaped clip 30 therein flushly with the surfaces of the housing 12. Each U-shaped clip is stamped from metal stock having good spring properties, such as brass, and comprises a transverse section 32 having a pair of parallel legs 34 extending therefrom. Note that no forming operations are necessary, the clip 30 being unformed, the profile being achieved wholly by stamping. Referring also to FIG. 2, the legs 34 are each stamped with a shoulder 38 for a snap-fit against the bottom of a standoff 22, the distal ends 36 being sized for interference fit in a plated through hole 42. The ends are tapered to accurately position the connector during insertion so that the tails 28 are aligned with pads 44; variations in height of the tails 28 is taken up by compliance against the board 40. The interference fit of ends 36 in holes 42 assures that the connector will remain so positioned during soldering. Since the distal ends 36 are of rectangular cross section and the plated through holes 42 are round, solder will flow into the remaining space in the hole 42 to provide a good anchor for the connector 10.

FIG. 3 shows the tails 28 of surface mount contacts 26 bearing against pads 44 on board 40. Soldering of these joints is most readily accomplished by infrared radiation of reflow solder on the pads 42. It is these joints which the U-clip anchoring scheme is designed to protect. Note that while a top entry connector 10 is shown, the invention is equally applicable to a side entry connector having right angle contacts therein.

The foregoing is exemplary and not intended to limit the scope of the claims which follow.

I claim:
1. An electrical connector for mounting to a printed circuit board, comprising:
an elongate dielectric housing having a top surface, an opposed bottom surface, and two parallel sidewalls,
a plurality of contacts mounted in the housing, the contacts having solder tails aligned with respective pads on the circuit board,
at least one U-shaped metal clip on the housing, the clip comprising a transverse portion and two parallel legs extending therefrom, the transverse portion being received flushly in the top surface of the housing, the legs being received in respective sidewalls, the legs having respective distal ends having a larger cross section than the rest of the leg, the distal ends extending beyond the bottom surface of the housing for interference fit in mounting holes in the circuit board,
a shoulder member provided on each of the legs, the shoulder members being stamped at the transition between the distal ends and the rest of the respective legs, such that the shoulder members cooper- ate with the bottom surface of the housing to provide a snap fit against the bottom of the housing to retain the clip to the housing.

2. An electrical connector as in claim 1 wherein two said U-shaped clips are provided, one being received on each end of said elongate housing.

3. An electrical connector as in claim 1 wherein at least one channel is molded in said housing, said channel being continuous between said top wall and adjacent sidewalls, said channel being profiled to receive the clip therein flushly with the top wall and sidewalls.

4. An electrical connector for mounting to a printed circuit board, comprising:
   an elongate dielectric housing having a top surface, an opposed bottom surface, and two parallel sidewalls,
   a plurality of contacts mounted in the housing, the contacts having solder tails aligned with respective conductive areas on the circuit board,
   at least one U-shaped metal clip on the housing, the clip comprising a transverse portion and two parallel legs extending therefrom, the transverse portion extending along the top surface of the housing, the legs extending along respective sidewalls, the legs having respective distal ends having a larger cross section than the rest of the leg, the distal ends extending beyond the bottom surface of the housing for interference fit in mounting holes in the circuit board,
   a shoulder member provided on each of the legs, the shoulder members being located at the transition between the distal ends and the rest of the respective legs, such that the shoulder members cooperate with the bottom surface of the housing to provide a snap fit against the bottom of the housing to retain the clip to the housing.

5. An electrical connector as in claim 4 wherein two said U-shaped clips are provided, one being received on each end of said elongate housing.

6. An electrical connector as in claim 4 wherein at least one channel is molded in said housing, said channel being continuous between said top wall and adjacent sidewalls, said channel being profiled to receive the clip therein flushly with the top wall and sidewalls.

* * * * *